United States Patent [19]

Sato et al.

[11] Patent Number: 4,963,242
[45] Date of Patent: Oct. 16, 1990

[54] PLASMA ETCHING APPARATUS

[75] Inventors: Masaaki Sato; Yoshinobu Arita, both of Kanagawa, Japan

[73] Assignee: Nippon Telegraph and Telephone Corporation, Tokyo, Japan

[21] Appl. No.: 354,906

[22] Filed: May 19, 1989

[30] Foreign Application Priority Data

| May 23, 1988 | [JP] | Japan | 63-123899 |
|---|---|---|---|
| Nov. 16, 1988 | [JP] | Japan | 63-287570 |
| Nov. 21, 1988 | [JP] | Japan | 63-292517 |
| Apr. 3, 1989 | [JP] | Japan | 1-84544 |

[51] Int. Cl.$^5$ ............................................. C23F 1/02
[52] U.S. Cl. ................................ 204/298.31; 156/345; 204/192.32; 204/298.34; 204/298.37
[58] Field of Search ............ 156/345; 204/298 E, 204/298 EP, 298 EE, 192.32; 422/186.05

[56] References Cited

U.S. PATENT DOCUMENTS

| 4,422,896 | 12/1983 | Class et al. | 156/643 |
|---|---|---|---|
| 4,431,473 | 2/1984 | Okano et al. | 156/345 |
| 4,464,223 | 8/1984 | Gorin | 156/345 X |
| 4,492,610 | 1/1985 | Okano et al. | 156/643 |
| 4,521,286 | 6/1985 | Horwitz | 204/298 EP |
| 4,572,759 | 2/1986 | Benzing | 156/345 |
| 4,585,516 | 4/1986 | Corn et al. | 204/298 EP |
| 4,668,338 | 5/1987 | Maydan et al. | 156/345 X |

FOREIGN PATENT DOCUMENTS

| 57-159026 | 10/1982 | Japan . |
|---|---|---|
| 62-501460 | 6/1987 | Japan . |
| 63-17530 | 1/1988 | Japan . |

OTHER PUBLICATIONS

7th Dry Process Symp., 1985 High Rate Etching of Silicon Dioxide, K. Kim et al.
18th Conference SSDM, Tokyo 1986 Double-Source Excited Reactive Ion Etching and Its Application to Submicron Trench Etching, M. Sato et al., pp. 233-236.

*Primary Examiner*—Nam X. Nguyen
*Attorney, Agent, or Firm*—Blakely, Sokoloff, Taylor & Zafman

[57] ABSTRACT

A plasma etching apparatus a first cathode electrode, an anode electrode, an annular second cathode electrode, a magnetic field applying unit and high-frequency power sources. An object to be etched is placed on the first cathode electrode. The anode electrode is arranged opposite to the first cathode electrode so as to be separated therefrom and connected to a constant potential source. The second cathode electrode is located between the first cathode electrode and the anode electrode and substantially surrounds the first cathode electrode in an insulated state. The magnetic field applying unit includes coils which generate lines of magnetic force passing through the annular second cathode electrode substantially parallel to a surface of the first cathode electrode on which the object to be etched is placed. The high-frequency power sources are respectively connected to the first and second cathode electrodes to generate a plasma by gas discharge, thereby generating ions near the first and second cathode electrodes.

8 Claims, 7 Drawing Sheets

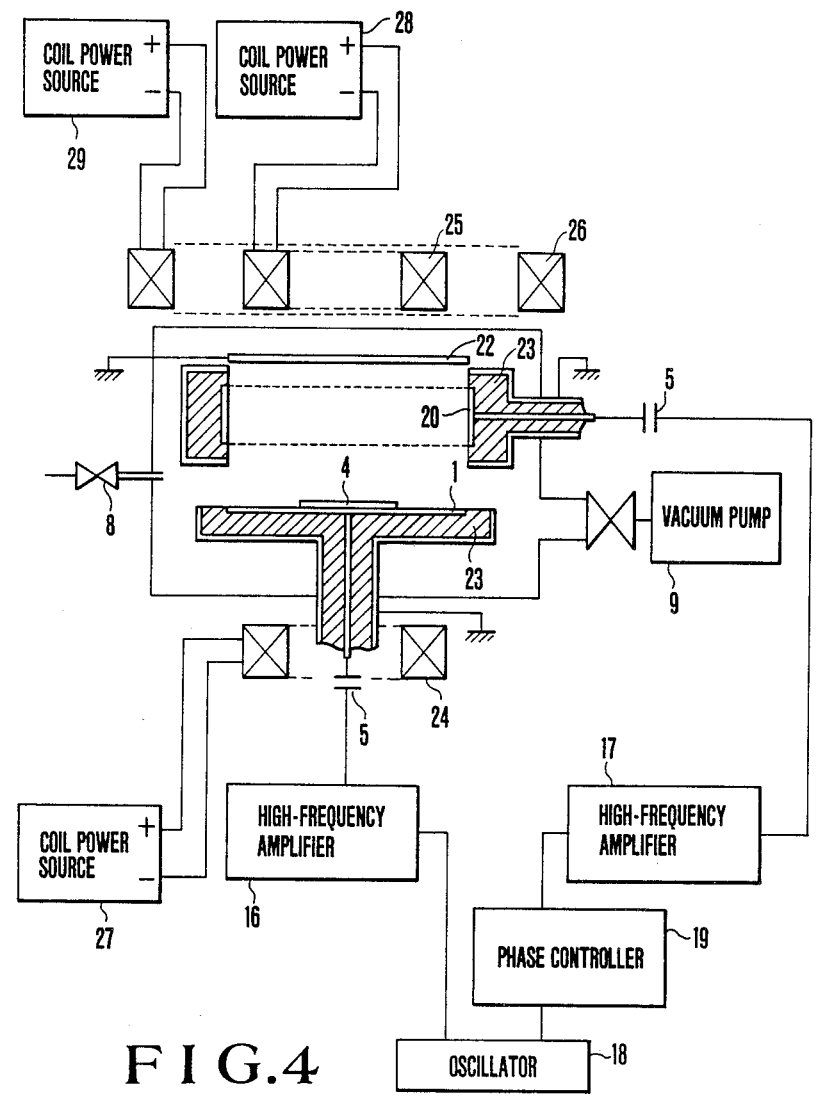
F I G. 4

PLASMA ETCHING APPARATUS

BACKGROUND OF THE INVENTION

The present invention relates to a plasma etching apparatus used in micropattering in fabrication of semiconductor devices.

In micropatterning in fabrication of semiconductor devices, plasma etching using a high-frequency glow discharge of a reactive gas is mainly used. In particular, in the process requiring high-precision control of dimensions and shapes, reactive ion etching (RIE) is mainly used wherein a sample (semiconductor wafer) is placed on a cathode electrode applied with high-frequency power and directional etching is performed with accelerated ions in a direction perpendicular to an electrode surface upon biasing of the cathode electrode to a negative voltage.

RIE etching characteristics change depending on types and amounts of radicals produced in a gaseous phase and the energy and density of ions incident on the cathode electrode which supports an object to be etched. An etching rate in normal conditions is a maximum of about several tens of nanometers/min. When high-frequency power is increased to increase the etching rate, the amount of radicals and an ion current density are increased, and ion energy is also increased, thus degrading selectivity with respect to an etching mask and an underlying layer and hence damaging semiconductor crystals. In order to increase the throughput, a large apparatus capable of processing a large number of semiconductor wafers is required. RIE poses a problem of etching shape errors caused by disturbing ions produced upon collision between accelerated ions and the neutral gas in an ion sheath on the cathode electrode when micropatterning is further advanced.

In order to solve the above problems, a so-called magnetron etching apparatus is proposed to increase the throughput by applying a magnetic field combined with a high-frequency electric field, thereby generating a plasma. An example of the magnetron etching apparatus is described in U.S. Pat. No. 4,422,896 issued to Walter H. Class et al. A similar magnetron etching apparatus is also described in Japanese Patent Laid-Open (Kokai) No. 57-159026 by Haruo Okano et al. In these apparatuses, electrons are drifted in a direction perpendicular to the electric and magnetic fields upon application of a magnetic field in a direction perpendicular to the high-frequency electric field. As a result, collision of the electrons with the gas is activated, and a discharge plasma density is increased. Since the density of an ion current supplied to the sample on the cathode electrode is increased, the etching rate can be increased to about ten times as compared with the conventional RIE apparatus. Therefore, the magnetron etching apparatus can have a sufficiently high throughput even if one substrate is etched, thereby obtaining a compact apparatus.

Another conventional etching apparatus using a coil as a magnetic field applying means is also known. An example of this etching apparatus is described in a Paper "SiO$_2$ High-Speed Etching", Kyungshik Kim et al., 7th Dry Process Symposium, p. 95, 1985. A magnetron etching apparatus using a coil is also described in Japanese Patent Laid-Open (Kokai) No. 63-17530 by Owen Wilkinson.

As described in Japanese Patent Publication No. 12346 and a paper "Double-source Excited Reactive Ion Etching and Its Application to Submicron Trench Etching", Masaaki Sato and Yoshinobu Arita, Extended Abstracts of the 18th (1986 International) Conference on Solid State Devices and Materials, Tokyo 233 (1986), which describe triode plasma etching apparatuses for independently controlling the ion energy, the current density, and the radial concentrations, an additional cathode is arranged to oppose a cathode electrode on which an object to be etched is placed, and a grid comprising a mesh or perforated plate is arranged as a common anode electrode between the cathode electrodes.

FIG. 7 is a schematic view for explaining the triode plasma etching apparatus. Reference numeral 21 denotes a vacuum chamber; 9, a vacuum pump connected to the vacuum chamber 21; 8, a gas supply system connected to the vacuum chamber 21; 1 and 2, first and second cathode electrodes arranged in the vacuum chamber 21; 6 and 7, high-frequency power sources respectively connected to the cathode electrodes 1 and 2; 5, blocking capacitors arranged between the high-frequency power source 6 and the cathode electrode 1 and between the high-frequency power source 7 and the cathode electrode 2, respectively; 3, a grid arranged between the cathode electrodes 1 and 2; and 4, an object to be etched, which is placed on the cathode electrode 1. In the triode plasma etching apparatus, a discharge area opposite to the cathode electrode 2 is divided by the grid 3 from a discharge area opposite to the cathode electrode 1 on which the object to be etched is placed. Upon application of high-frequency power to the cathode electrode 2, decomposition and ionization of the gas are accelerated to increase the density of active radicals and a plasma density of the discharge area of the cathode electrode 1 which supports the object through the grid 3. Therefore, the amount of ion current supplied to the object and the amount of active radicals can be increased. As compared with the counterelectrode type plasma etching apparatus, the etching rate can be increased to 2 to 4 times. In addition, the width of the ion sheath formed on the surface of the object to be etched is decreased with an increase in ion current density. Therefore, disturbance of the ions caused by collision with gas molecules in the ion sheath can be suppressed. Therefore, etching in a depth about 10 times the width of 0.25 μm of a submicron area can be performed with high precision.

In the conventional magnetron RIE apparatus using a permanent magnet, the magnetic field generated by the permanent magnet is fixed, and flexibility of etching conditions is degraded. For example, the ion energy and its current density cannot be independently controlled. In addition, high-precision etching uniformity control cannot be performed. In the apparatus using the coil, although flexibility of the etching conditions can be improved as compared with the apparatus using a permanent magnet, it is difficult to independently control the ion energy and its current density.

In various types of magnetron etching apparatuses in which magnetic fields are changed as a function of time, e.g., a coil or a permanent magnet is physically moved, or a current supplied to a coil is changed as a function of time, a change in magnetic field is slower than a change in high-frequency electric field as a function of time. This causes variations in ion energy and its directivity, thus causing element damage and degradation in etching shapes.

In the conventional triode etching apparatus, flexibility of the etching conditions is increased, and the ion energy and its current density can be independently controlled. In addition, discharge variations as a function of time can be eliminated, so that damage and degradation of etching shapes can be eliminated. However, the throughput of the triode etching apparatus is not sufficient as compared with the magnetron etching apparatus due to the following reason. The plasma generated in the discharge area of the cathode electrode 2 is diffused to the discharge area of the cathode electrode 1, and a large amount of the plasma generated in the discharge area of the cathode electrode 2 is not guided to the object 4 but is diffused to be recombined. Therefore, even if the high-frequency power applied to the cathode electrode 2 is increased, an increase in density of the ion current supplied to the object 4 is saturated. In addition, nonuniform etching also occurs by the influence of the grid 3.

SUMMARY OF THE INVENTION

It is an object of the present invention to provide a plasma etching apparatus wherein an etching rate can be increased while good etching characteristics are maintained.

It is another object of the present invention to provide a plasma etching apparatus wherein uniformity of a plasma potential on a surface of a first cathode electrode can be improved as compared with a conventional etching apparatus.

It is still another object of the present invention to provide a plasma etching apparatus wherein a density of an ion current supplied to an object to be etched can be further increased.

In order to achieve the above object of the present invention, there is a plasma etching apparatus comprising an anode electrode arranged to oppose a first cathode electrode and connected to a constant voltage, magnetic field applying means for applying a magnetic field whose lines of magnetic force pass near the first cathode electrode and a second cathode electrode, the second cathode electrode being an annular electrode to surround the first cathode electrode, and high-frequency power sources respectively connected to the first and second cathode electrodes.

In a means for enhancing interference between discharges generated by the high-frequency voltage, frequencies of high-frequency voltages applied from the high-frequency power sources to the cathode electrodes are set to be equal to each other, and phases of the high-frequency voltages applied to the first and second cathode electrodes are set to be variable.

In this case, the phase of the high-frequency voltage applied to the second cathode electrode advances first cathode electrode by 0 to ½ the wavelength.

The magnetic field applying means comprises a first magnetic field generating coil arranged on a side of the first cathode electrode which is opposite to a side on which the second cathode electrode is preset, a second magnetic field generating coil arranged on a side of the second cathode electrode which is opposite to a side on which the first cathode electrode is present, and coil power sources for supplying opposite currents to the first and second magnetic field generating coils, wherein the currents are controlled such that the lines of magnetic force are almost parallel to the first cathode electrode.

The magnetic field applying means comprises a first magnetic field generating coil located opposite to the anode electrode and near the first cathode electrode, a second magnetic field generating coil arranged to be surrounded by the second cathode electrode, a third magnetic field generating coil arranged to surround the second cathode electrode, and coil power sources for supplying currents having the same direction to the first and third magnetic field generating coils and a current to the second magnetic field generating coil in a direction opposite to the first and third magnetic field generating coils. Alternatively, the magnetic field applying means comprises a first magnetic field generating coil located opposite to the anode electrode and near the first cathode electrode, a second magnetic field generating coil arranged to surround the first magnetic field generating coil and having a diameter larger than that of the first magnetic field generating coil, a third magnetic field generating coil arranged to be surrounded by the second cathode electrode, a fourth magnetic field generating coil arranged to surround the second cathode electrode, and coil power sources for supplying currents having the same direction to the first and fourth magnetic field generating coils and currents to the second and third magnetic field generating coils in a direction opposite to the first and fourth magnetic field generating coils, wherein the currents of the power sources are controlled such that the lines of magnetic force are almost parallel to the surfaces of the first and second cathode electrodes.

The anode electrode opposite to the first cathode electrode is connected to a constant voltage, and the second cathode electrode is the annular electrode which surrounds the first cathode electrode. The magnetic field applying means is arranged to apply magnetic fields whose lines of magnetic force pass near the first and second cathode electrodes, so that the density of a plasma enclosed by the magnetic fields is increased. In addition, since electrons are moved along the lines of magnetic force, plasma interference by the high-frequency voltages applied to the first and second cathodes is increased. Since the anode electrode connected to the constant voltage is present opposite to the first cathode electrode, uniformity of the potential of the plasma enclosed between the first cathode electrode and the anode electrode is improved as compared with the conventional apparatus. The grid used in the conventional triode RIE apparatus to assure uniformity of the plasma potential can be omitted. For this reason, the plasma generated by the high-frequency power applied to the second cathode electrode is effectively guided near the first cathode electrode, and the density of the ion current applied to the object to be etched can be increased. In addition, since the grid is not used, slight nonuniformity of the plasma density which is caused by the presence of the grid can be eliminated.

Since the frequencies of the high-frequency voltages applied from the high-frequency power sources to the cathode electrodes are set to be equal to each other, the variations in high-frequency voltages as a function of time, which are applied to the first and second cathode electrodes, can be eliminated. The phase of the high-frequency voltage applied to the second cathode electrode is advanced from that applied to the first cathode electrode by 0 to ½ the wavelength, so that the density of the plasma near the object to be etched can be increased, and the density of the ion current supplied to the object to be etched can be increased.

At this time, the magnetic field applying means comprises the first magnetic field generating coil arranged on a side of the first cathode electrode which is opposite to the side on which the second cathode electrode is present, the second magnetic field generating coil arranged on a side of the second cathode electrode which is opposite to the side on which the first cathode electrode is present, and the coil power sources for supplying currents in the opposite directions to the first and second magnetic field generating means, so that the lines of magnetic force are almost parallel to the surface of the first cathode electrode. The direction of the magnetic flux on the electrode surface is parallel to the direction of the electric field, so that the electrons are subjected to drift motion to turn above the electrode. Collision between the electrons and the gas is enhanced to increase the plasma density. In addition, since the lines of magnetic force pass in the radial direction of the object to be etched, mobility of electrons in the radial direction can be enhanced. Therefore, uniformity of the plasma density on the object to be etched can be improved.

Further, in this case, the magnetic field applying means comprises the first magnetic field generating coil arranged opposite to the anode electrode and near the first cathode electrode, the second magnetic field generating coil arranged to be surrounded by the second cathode electrode, the third magnetic field generating coil arranged to surround the second cathode electrode, and the coil power sources for supplying the currents having the same direction to the first and third magnetic field generating coils and a current to the second magnetic field generating coil in a direction opposite to that supplied to the first and third magnetic field generating coils, wherein the currents are supplied such that the lines of magnetic force almost parallel to the first cathode electrode are also almost parallel to the second cathode electrode. The direction of the magnetic flux is perpendicular to the direction of the electric field on the first and second cathode electrodes. The electrons are subjected to drift movement to turn above both the electrodes, and collision between the electrons and the gas is enhanced. Therefore, the plasma density is increased. Since the electrons are moved along the lines of magnetic force, plasma interference by the high-frequency voltages applied to the first and second cathode electrodes is increased. The phase of the high-frequency voltage applied to the second cathode electrode is advanced from that applied to the first cathode electrode by 0 to ½ the wavelength, so that the plasma density near the object to be etched is increased, and the density of the ion current supplied to the object to be etched is increased. Furthermore, since the lines of magnetic force pass in the radial direction of the object to be etched, the electrons can be easily moved in the radial direction. Therefore, the uniformity of the plasma density on the object to be etched can be improved.

The magnetic field applying means comprises a first magnetic field generating coil located opposite to the anode electrode and near the first cathode electrode, a second magnetic field generating coil arranged to surround the first magnetic field generating coil and having a diameter larger than that of the first magnetic field generating coil, a third magnetic field generating coil arranged to be surrounded by the second cathode electrode, a fourth magnetic field generating coil arranged to surround the second cathode electrode, and coil power sources for supplying currents having the same direction to the first and fourth magnetic field generating coils and currents to the second and third magnetic field generating coils in a direction opposite to the first and fourth magnetic field generating coils, wherein the currents of the power sources are controlled such that the lines of magnetic force almost parallel to the first cathode electrode are also almost parallel to the second cathode electrode. The same effect as in the arrangement having three coils is obtained in this apparatus. However, the arrangement having four coils can set so that the lines of magnetic force are perfectly parallel to the first and second cathode electrodes as compared with the arrangement having three coils, and the plasma density can be further uniformed.

BRIEF DESCRIPTION OF THE DRAWINGS

FIG. 4 is a schematic view showing a plasma etching apparatus according to another embodiment of the present invention;

DESCRIPTION OF THE PREFERRED EMBODIMENTS

Figure 1:
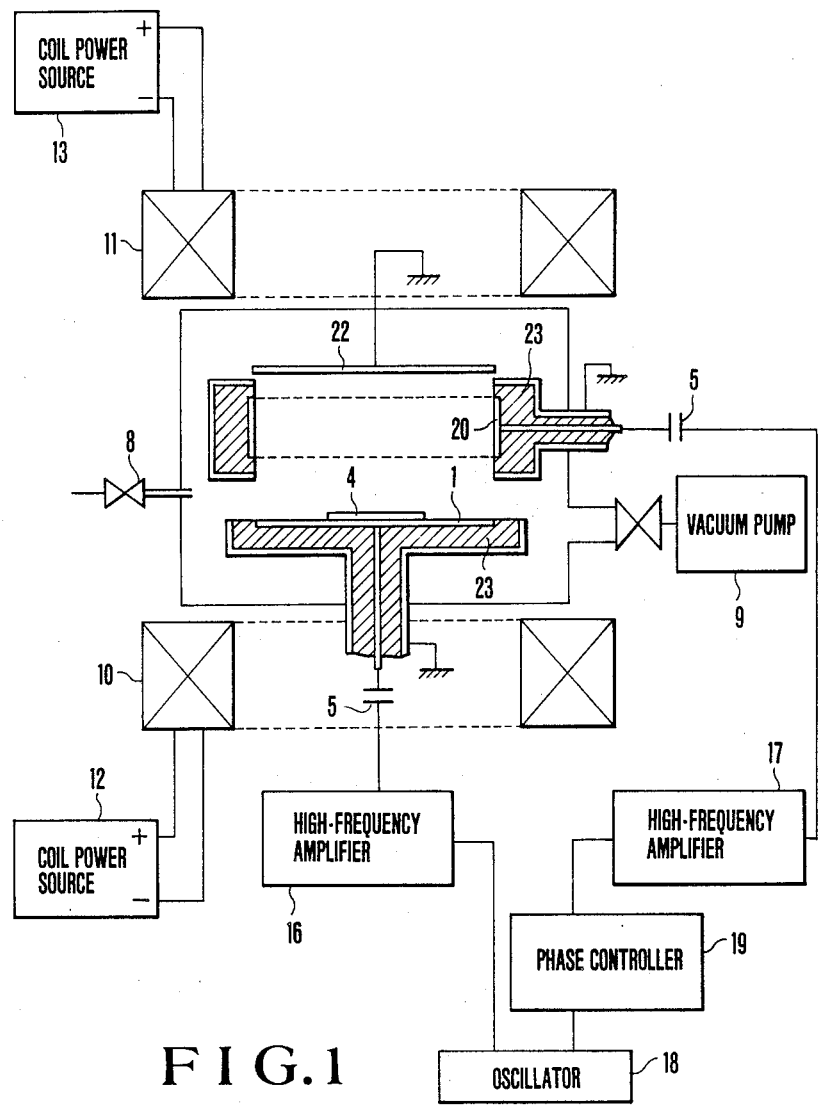
FIG. 1 is a schematic view showing a plasma etching apparatus according to an embodiment of the present invention.

FIG. 1 shows a plasma etching apparatus according to an embodiment of the present invention. Referring to FIG. 1, reference numeral 10 denotes a first magnetic field generating coil arranged on a side of a first cathode electrode 1 which is opposite to a side on which a second cathode electrode 20 is located; 11, a second magnetic field generating coil arranged on a side of the cathode electrode 20 which is opposite to the side on which the cathode electrode 1 is located; and 12 and 13, coil power sources for supplying currents to the magnetic field generating coils 10 and 11. The magnetic field generating coils 10 and 11 and the coil power sources 12 and 13 constitute a magnetic field applying means. Reference numerals 16 and 17 denote high-frequency amplifiers connected to the cathode electrodes 1 and 20, respectively; 18, an oscillator connected to the high-frequency amplifiers 16 and 17; and 19, a phase controller arranged between the oscillator 18 and the high-frequency amplifier 17. The high-frequency amplifiers 16 and 17, the oscillator 18, and the phase controller 19 constitute high-frequency power sources. Reference numeral 22 denotes a grounded anode electrode opposite to the cathode electrode 1; and 20, a second cathode electrode, i.e., an annular electrode arranged between the cathode electrode 1 and the anode electrode 22. In this embodiment, the second cathode electrode 20 comprises a cylindrical body. Reference numeral 23 denotes an insulating material for insulating the cathode electrodes 1 and 20 from a ground potential. The second cathode and the coils are almost concentric with each other.

An $SiO_2$ film formed on a single-crystal Si is etched by the plasma etching apparatus of FIG. 1 by using an organic resist film pattern as a mask. A vacuum chamber 21 is evacuated by a vacuum pump 9, and a reactive gas such as $CHF_3$ gas is supplied from a gas supply system 8 to the vacuum chamber 21 at a flow rate of 50 SCCM to set a pressure of the vacuum chamber to be 0.8 Pa. At the same time, currents of 9,000 A turn and 4,000 A turn are supplied from the coil power sources 12 and 13 to the magnetic field generating coils 10 and 11, respectively. Therefore, a magnetic field having a magnetic flux density of several tens to several hundreds of gauss on the cathode electrode 1 and lines of magnetic force which are almost parallel to the cathode electrode 1 and pass near the cathode electrode 20 is applied. High-frequency powers of 150 W and 200 W having frequencies of 13.56 MHz are applied from the high-frequency amplifiers 16 and 17 to the cathode electrodes 1 and 20. The reactive gas is decomposed and ionized to generate a plasma, thereby etching an object 4 to be etched.

In this case, an electric field formed upon application of the high-frequency power to the cathode electrode 1 is almost perpendicular to the surface of the cathode electrode 1 near this electrode. Since the magnetic field has a component parallel to the cathode electrode 1, electrons are subjected to cyclotron movement around the lines of magnetic force and are drifted in a direction, i.e., the ExB direction, perpendicular to the electric field E and the magnetic flux density B. This direction is a circularly turning direction along the surface of the cathode electrode 1. Therefore, collision between the electrons and the gas is enhanced immediately above the surface of the cathode electrode 1, thereby increasing the plasma density. In a conventional triode RIE apparatus, when a magnetic field is applied to a sample, a plasma potential is set to be a larger negative potential toward the center of the cathode electrode 1 in the absence of the grid 3, and it is therefore difficult to assure etching uniformity. However, in the plasma etching apparatus of this embodiment, since the anode electrode 22 is arranged opposite to the cathode electrode 1 and the anode electrode is located in a direction in which mobility of electrons which are easily moved in the direction of the lines of magnetic force is increased. Therefore, the high-frequency current is supplied between the cathode electrode 1 and the anode electrode 22, and uniformity of the plasma potential on the surface of the cathode electrode 1 can be improved. For this reason, the grid can be omitted, and slight etching nonuniformity can be eliminated. In addition, loss of the plasma density upon insertion of the grid can also be eliminated. Even if the high-frequency powers applied to the cathode electrodes are equal to each other, the plasma density can be increased, and the density of the ion current supplied to the object 4 can be increased. The etching rate can be increased, and variations in ion incidence direction can be perfectly suppressed. In addition, ion energy can be reduced, and damage to the object 4 can be minimized.

Figure 2:
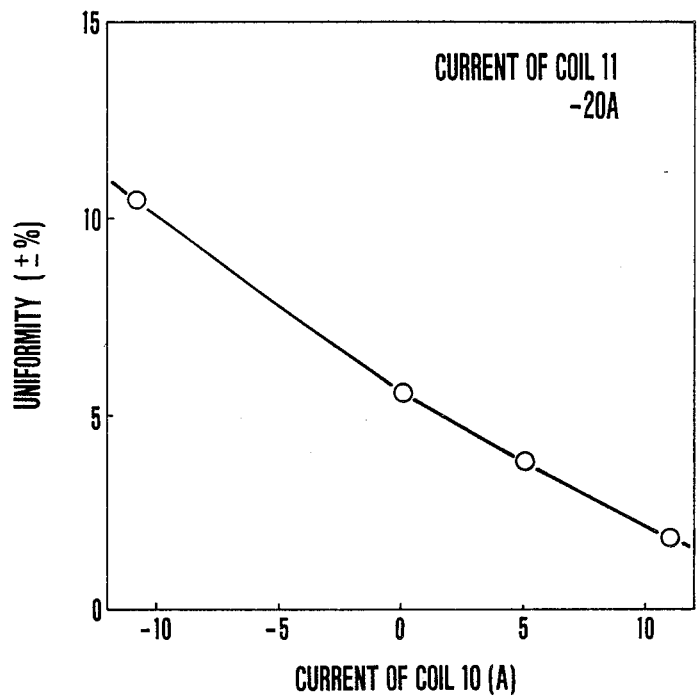
FIG. 2 is a graph showing etching uniformity and currents supplied to coils 10 and 11.

According to experiments of the present inventors, when a magnetic field was not applied in etching using the plasma etching apparatus shown in FIG. 1, an etching rate was about 80 nm/min. However, when the magnetic field was applied in etching, the etching rate was increased to about 500 nm/min. A relationship between the currents supplied to the coils 10 and 11 and etching uniformity is shown in FIG. 2. The lines of magnetic force were radially spread from the center of the cathode electrode 1 upon current control, and the density of electrons in the radial direction of the electrode could be uniformed. Therefore, etching uniformity could fall within the range of ±2% on a 10-cm wafer.

Figure 3:
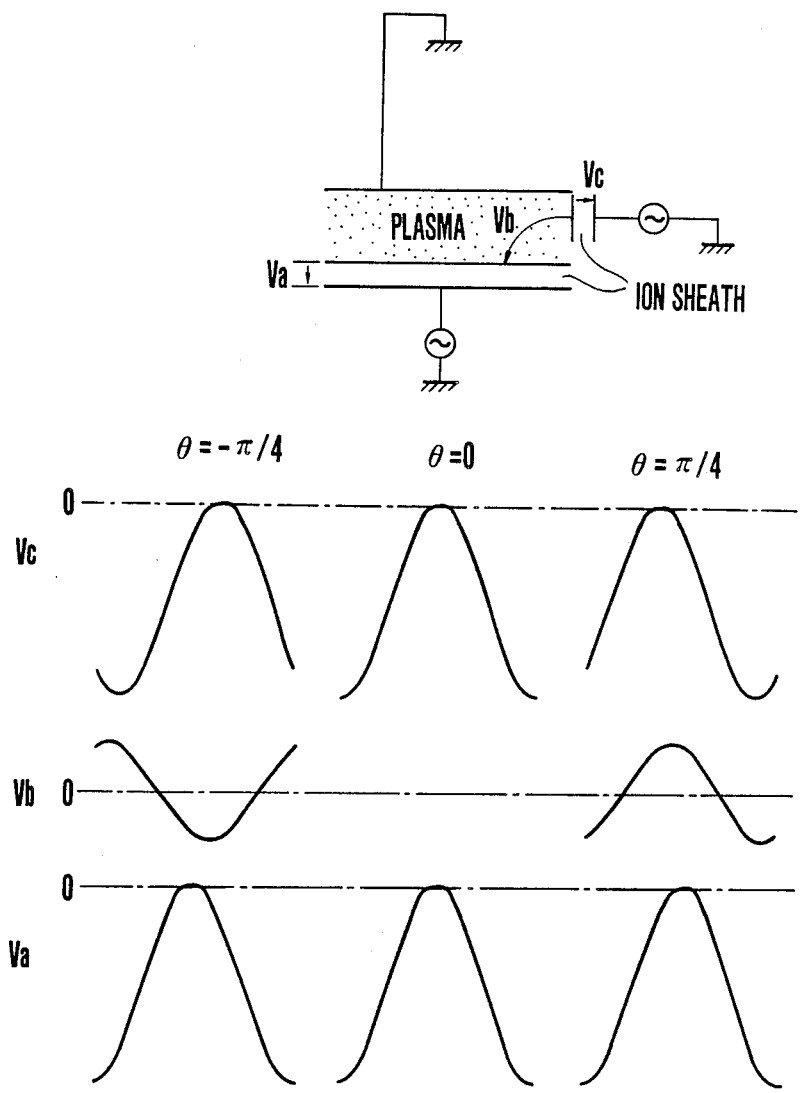
FIG. 3 is a waveform chart showing a waveform of a high-frequency voltage (Va) applied to an ion sheath on a cathode electrode 1, a waveform of a high-frequency voltage (Vc) applied to a cathode electrode 2, a waveform of a difference (Vb) between a potential of a plasma near the ion sheath on the cathode electrode 1 and a potential of a plasma near the ion sheath on the cathode electrode 2 when phases between the cathode electrodes 1 and 2 are shifted from each other.

In the plasma etching apparatuses shown in FIG. 1, since the frequencies of the high-frequency voltages applied to the cathode electrodes 1 and 20 are equal to each other, an increase in maximum ion energy caused by a beat of the two frequencies does not occur. In addition, the phase of the high-frequency voltage applied to the cathode electrode 20 is shifted from that applied to the cathode electrode 1, and therefore the interference between the discharge cycles of the high-frequency voltages applied to the cathode electrodes 1 and 20 is changed. The plasma density is changed accordingly, and the plasma density distribution between the electrodes can be changed. This phenomenon is caused by an effect of an electron flow upon a change in potential distribution in the plasma and will be described as follows. FIG. 3 shows a waveform of a high-frequency voltage (Va) applied to the ion sheath on the cathode electrode 1, a waveform of a high-frequency voltage (Vc) applied to the sheath of the cathode electrode 20, and a waveform of a difference (Vb) between the plasma potential near the ion sheath on the cathode electrode 1 and the plasma potential near the ion sheath on the cathode electrode 20. When no phase difference is present ($\theta=0$), no potential difference occurs (Vb=0). However, when the phase of the high-frequency voltage applied to the cathode electrode 20 is advanced ($\theta=\pi/4$), the phase of the difference Vb is close to that of the voltage Va and is opposite to that of the voltage Vc. When motion of electrons is taken into consideration and the voltage Va is almost equal to the potential of the electrode, the difference Vb is increased, and the electrons are concentrated on the cathode electrode 1, thereby increasing the plasma density near the object to be etched. To the contrary, when the phase of the high-frequency voltage applied to the cathode electrode 20 is lagged ($\theta=-\pi/4$), electrons are concentrated near the cathode electrode 20, and the plasma density near the object to be etched is decreased. Therefore, when the phase of the high-frequency voltage applied to the cathode electrode 20 is slightly advanced from the phase of the high-frequency voltage applied to the cathode electrode 1, etching at a maximum ion current density and a minimum ion energy can be performed. According to the experiments of the present inventors, when the phase of the high-frequency voltage applied to the cathode electrode 20 was advanced from that applied to the cathode electrode 1 by 0 to $+\frac{1}{8}$ (inclusive) the wavelength, the electrons tended to be concentrated on the cathode 1. However, since high-frequency interference caused a decrease in plasma density upon an increase in phase difference as a whole, the wavelength range in which an increase in plasma density occurred as compared with no phase difference was given such that the phase of the voltage applied to the cathode electrode 20 fell within the range of 0 to $+\frac{1}{8}$ the wavelength. The plasma density was maximized by the interfence between the two high-frequency powers in the range of $+\frac{1}{8}$ to $+\frac{1}{4}$ the wavelength. The phase different which causes the maximum plasma density is changed upon a change in ratio of high-frequency powers supplied to the two electrodes. More specifically, when the high-frequency power supplied to the cathode electrode 20 is increased, the phase different which causes the maximum plasma density is increased.

In the above embodiment, the cylindrical electrode is used as the second cathode electrode 20. However, if the second cathode electrode 20 can surround the cathode electrode 1, the shape of the second cathode electrode 20 is not limited to the cylindrical shape, but can be a polygonal hollow shape, an elliptical shape, or an incomplete annular shape if the drift of electrons by E x B has a turning motion. In this case, the same voltage need not be applied to the divided portions, and the phases of these divided portions need not be equal to each other. In the above embodiment, the pressure of the vacuum chamber 21 is set to be 0.8 Pa. However, the pressure in the vacuum chamber 21 may fall within the range of 0.1 to 100 Pa. $CHF_3$ is used as an etching gas. However, other halogen-containing gases or oxygen-containing gases may be used and other objects to be etched may be employed to obtain the same effect as described above.

In the etching apparatus shown in FIG. 1, two coils are used to apply magnetic fields. However, other means such as permanent magnets may be used to produce a magnetic flux distribution for obtaining the same effect as described above.

Figure 5:
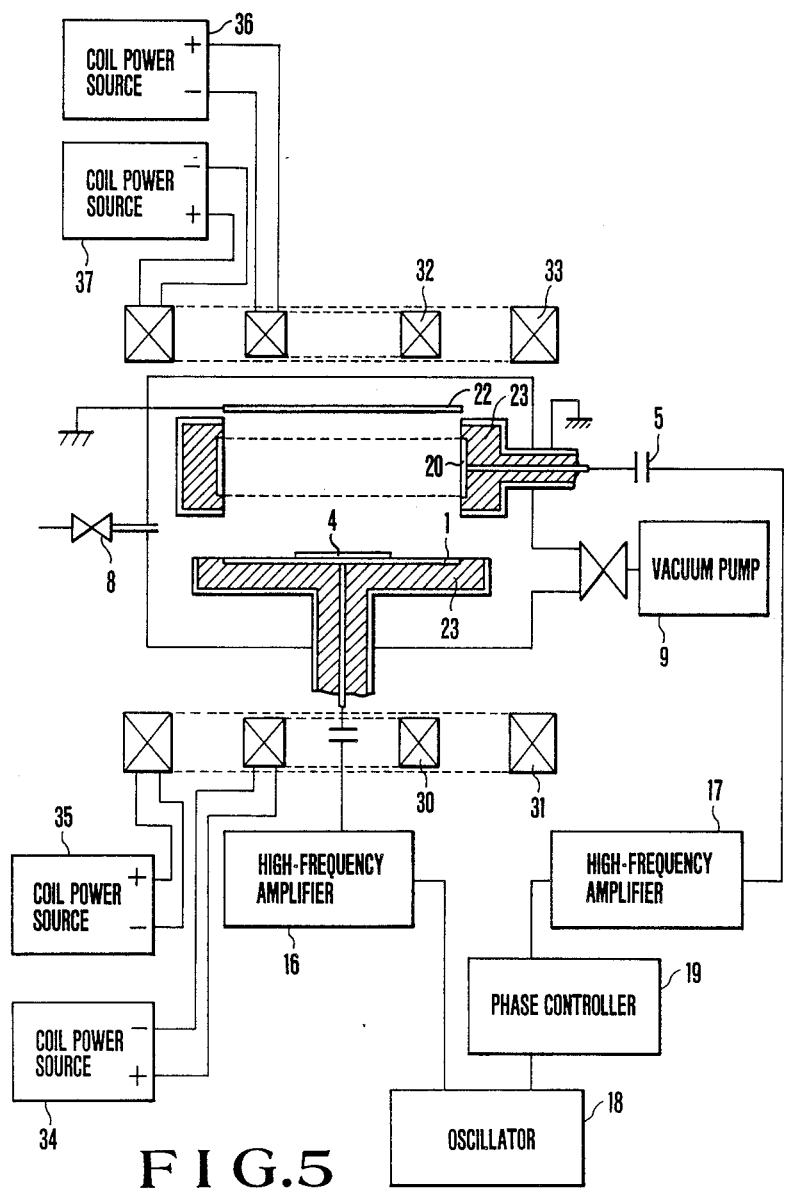
FIG. 5 is a schematic view showing a plasma etching apparatus according to still another embodiment of the present invention.

FIG. 4 shows another embodiment of the present invention. This embodiment employs three coils. Reference numeral 24 denotes a first magnetic generating coil arranged to oppose an anode electrode 22 and near a cathode electrode 1; 25, a second magnetic field generating coil arranged to be surrounded by a cathode electrode 20; 26, a third magnetic field generating coil arranged to surround the cathode electrode 20; and 27, 28, and 29, coil power sources for supplying currents to the magnetic field generating coils 24, 25, and 26. The magnetic field generating coils 24, 25, and 26 and the coil power sources 27, 28, and 29 constitute a magnetic field applying means. In this case, the currents having the same direction are supplied to the magnetic field generating coils 24 and 26, and an opposite current is supplied to the magnetic field generating coil 25. FIG. 5 shows still another embodiment using four coils. Reference numeral 30 denotes a first magnetic field generating coil arranged opposite to an anode electrode 22 and near a cathode electrode 1; 31, a second magnetic field generating coil arranged to surround a cathode electrode 20 and having a diameter larger than that of the first magnetic field generating coil 30; 32, a third magnetic field generating coil arranged to be surrounded by the cathode electrode 20; 33, a fourth magnetic field generating coil arranged to surround the cathode electrode 20; and 34, 35, 36, and 37, coil power sources for supplying currents to the magnetic field generating coils 30, 31, 32, and 33. The magnetic field generating coils 30, 31, 32, and 33 and the coil power sources 34, 35, 36, and 37 constitute a magnetic field applying means. In this case, a current having the same direction is supplied to the magnetic field generating coils 30 and 33, and a current having a direction opposite to that of the coils 30 and 33 is supplied to the magnetic field generating coils 31 and 32.

Figure 6A:
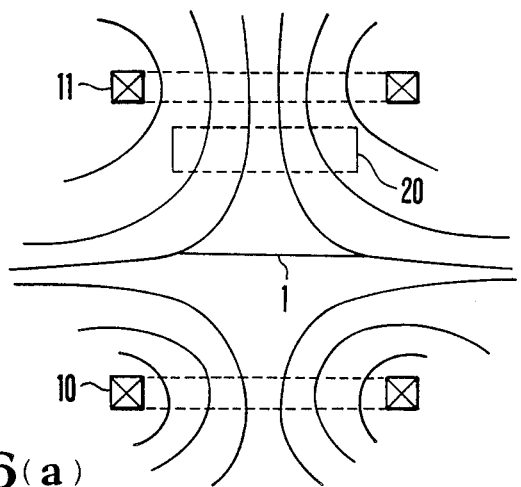
FIGS. 6a, b and c are views showing lines of magnetic force when the numbers of coils is two, three, and four coils.
Figure 6B:
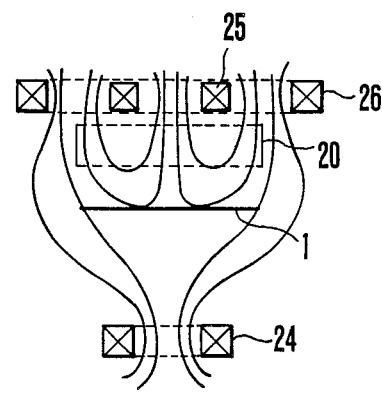
Figure 6C:
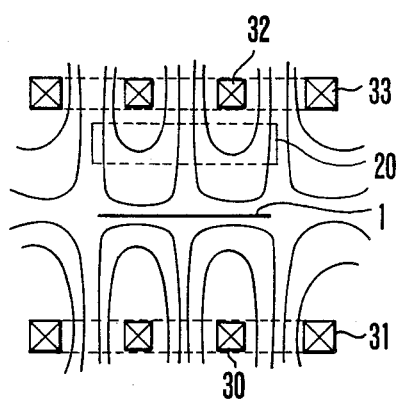
Figure 7:
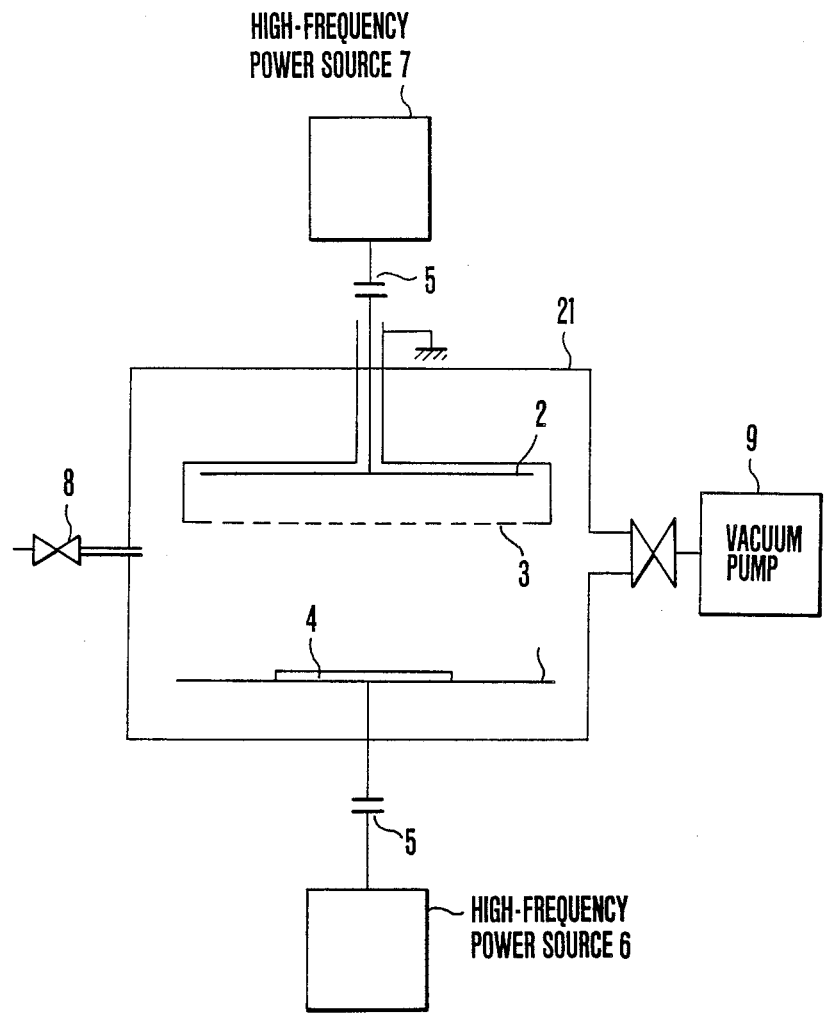
FIG. 7 is a schematic view showing a conventional triode plasma etching apparatus.

The lines of magnetic force from the two coils (the embodiment in FIG. 1), the three coils (the embodiment in FIG. 4), and the four coils (the embodiment in FIG. 5) are shown in FIGS. 6(a), 6(b), and 6(c), respectively. In the arrangement having two coils, the lines of magnetic force passing parallel to the electrode surface near the cathode electrode 20 cross the cathode electrode 1. However, in the arrangement having three or four coils, the lines of magnetic force passing parallel to the electrode surface near the cathode electrode 20 can also be parallel to the surface of the cathode electrode 1. In particular, in the arrangement having the four coils, the values of currents supplied to the coils can be optimized, and the parallel relationship between the lines of magnetic force and the cathode electrode 1 can be further improved. When a magnetic field whose lines of magnetic force passing parallel to the surfaces of the first and second electrodes 1 and 20 is applied, electrons are subjected to drift motion to turn almost parallel to the surface of the cathode electrode 20, so that the discharge is of a magnetron type. Therefore, collision between the electrons and the gas is enhanced to increase the plasma density. In addition, the electrons are subjected to the turning drift motion with respect to the center of the cathode electrode 1, so that discharge on the surface of the cathode electrode 1 is of a magnetron type. Therefore, the plasma density can be increased. Furthermore, since the lines of magnetic force pass near the cathode electrodes 1 and 20, the interference between the discharge cycles by the high-frequency voltages applied to the respective cathode electrodes can be enhanced. When the phase of the high-frequency voltage applied to the cathode electrode 20 is advanced from that applied to the cathode electrode 1 by 0 to $\frac{1}{8}$ the wavelength, the plasma density near the cathode electrode 1 can be further increased. The density of the ion current supplied to the object 4 to be etched can be increased accordingly. The etching rate can therefore increased. According to the experiments of the present inventors, etching uniformity is closely associated with the parallel relationship between the lines of magnetic force passing near the cathode electrode 1 and its surface. Etching uniformity can be improved when the parallel relationship has higher precision. Therefore, the etching conditions for better uniformity can be easily obtained when the four coils which achieve the better parallel relationship are used.

When the plasma etching apparatus according to the present invention is used in the fabrication process of semiconductor devices, etching of smaller micropatterning width than the widths obtained by the conventional process can be performed with a high throughput. In addition, damage to the semiconductor devices can be reduced, the manufacturing cost of semiconductor devices can be reduced, and the performance of the semiconductor devices can be remarkably improved.

The anode electrode opposite to the first cathode electrode is connected to a constant voltage, and the second cathode electrode is the annular electrode which surrounds the first cathode electrode. The magnetic field applying means is arranged to apply magnetic fields whose lines of magnetic force pass near the first and second cathode electrodes, so that the density of a plasma enclosed by the magnetic fields is increased. In addition, since electrons are moved along the lines of magnetic force, plasma interference by the high-frequency voltages applied to the first and second cathodes is increased. The plasma density can be increased. Since the high-frequency power to be applied to the first cathode electrode is increased while the ion energy is kept low, an etching rate can be increased while good etching characteristics are maintained. Since the anode electrode connected to the constant voltage is present opposite to the first cathode electrode, uniformity of the potential of the plasma enclosed between the first cathode electrode and the anode electrode is improved as compared with the conventional apparatus. The grid used in the conventional triode RIE apparatus to assure uniformity of the plasma potential can be omitted. For this reason, the plasma generated by the high-frequency power applied to the second cathode electrode is effectively guided near the first cathode electrode, and the density of the ion current applied to the object to be etched can be increased. In addition, since the grid is not used, slight nonuniformity of the plasma density which is caused by the presence of the grid can be eliminated. Therefore, etching uniformity can be improved.

Since the frequencies of the high-frequency voltages applied from the high-frequency power sources to the cathode electrodes are set to be equal to each other, the variations in high-frequency voltages as a function of time, which are applied to the first and second cathode electrodes, can be eliminated. The phase of the high-frequency voltage applied to the second cathode electrode is advanced from that applied to the first cathode electrode by 0 to ⅓ the wavelength, so that the density of the plasma near the object to be etched can be increased, and the density of the ion current supplied to the object to be etched can be increased. Therefore, the etching rate can be further increased.

At this time, the magnetic field applying means comprises the first magnetic field generating coil arranged on a side of the first cathode electrode which is opposite to the side on which the second cathode electrode is present, the second magnetic field generating coil arranged on a side of the second cathode electrode which is opposite to the side on which the first cathode electrode is present, and the coil power sources for supplying currents in the opposite directions to the first and second magnetic field generating means, so that the lines of magnetic force are almost parallel to the surface of the first cathode electrode. The direction of the magnetic flux on the electrode surface is parallel to the direction of the electric field, so that the electrons are subjected to drift motion to turn above the electrode. Collision between the electrons and the gas is enhanced to increase the plasma density, and a high etching rate can be obtained. In addition, since the lines of magnetic force pass in the radial direction of the object to be etched, and mobility of electrons in the radial direction can be enhanced. Therefore, uniformity of the plasma density on the object to be etched can be improved, and etching uniformity can be further improved.

Further, in this case, the magnetic field applying means comprises the first magnetic field generating coil arranged opposite to the anode electrode and near the first cathode electrode, the second magnetic field generating coil arranged to be surrounded by the second cathode electrode, the third magnetic field generating coil arranged to surround the second cathode electrode, and the coil power sources for supplying the currents having the same direction to the first and third magnetic field generating coils and a current to the second magnetic field generating coil in a direction opposite to that supplied to the first and second magnetic field generating coils, wherein the currents are supplied such that the lines of magnetic force almost parallel to the first cathode electrode are also almost parallel to the second cathode electrode. The direction of the magnetic flux is perpendicular to the direction of the electric field on the first and second cathode electrodes. The electrons are subjected to drift movement to turn above both the electrodes, and collision between the electrons and the gas is enhanced. Therefore, the plasma density is increased. Since the electrons are moved along the lines of magnetic force, plasma interference by the high-frequency voltages applied to the first and second cathode electrodes is increased. The phase of the high-frequency voltage applied to the second cathode electrode is advanced from that applied to the first cathode electrode by 0 to ⅓ the wavelength, so that the plasma density near the object to be etched is increased, and the density of the ion current supplied to the object to be etched is increased. Therefore, a higher etching rate can be obtained. Furthermore, since the lines of magnetic force pass in the radial direction of the object to be etched, the electrons can be easily moved in the radial direction. Therefore, the uniformity of the plasma density on the object to be etched can be improved, and high etching uniformity can be obtained.

The magnetic field applying means comprises a first magnetic field generating coil located opposite to the anode electrode and near the first cathode electrode, a second magnetic field generating coil arranged to surround the first magnetic field generating coil and having a diameter larger than that of the first magnetic field generating coil, a third magnetic field generating coil arranged to be surrounded by the second cathode electrode, a fourth magnetic field generating coil arranged to surround the second cathode electrode, and coil power sources for supplying currents having the same direction to the first and fourth magnetic field generating coils and currents to the second and third magnetic field generating coils in a direction opposite to the first and fourth magnetic field generating coils, wherein the currents of the power sources are controlled such that the lines of magnetic force almost parallel to the first cathode electrode are also almost parallel to the second cathode electrode. The same effect as in the arrangement having three coils is obtained. However, the arrangement having four coils can set so that the lines of magnetic force are perfectly parallel to the first and second cathode electrodes as compared with the arrangement having three coils, and the plasma density can be further uniformed. Therefore, high etching uniformity can be easily obtained.

According to the present invention, the magnetic field is basically a static field and does not accompany variations as a function of time. Variations in ion energy and direction of ions which are caused by variations in magnetic field do not occur. Therefore, damage to the object to be etched can be minimized. In addition, etching having excellent etching shape precision with good directivity can be performed at a high throughput.

In the plasma etching apparatus of the present invention, the high-frequency powers respectively applied to the first and second cathode electrodes and the degree of interference between the discharge cycles of the high-frequency voltages are adjusted to arbitrarily control the ion energy incident on the object to be etched, the current density, and the radical concentrations, thereby easily obtaining optimal etching conditions.

As is apparent from the above description, the present invention provides the above remarkable advantages and effects.

What is claimed is:

1. A plasma etching apparatus comprising:
   a first cathode electrode on which an object to be etched is placed;
   an anode electrode arranged opposite to said first cathode electrode so as to be separated therefrom and connected to a constant potential source;
   an annular second cathode electrode located between said first cathode electrode and said anode electrode and substantially surrounding said first cathode electrode in an insulated state;
   magnetic field applying means for generating lines of magnetic force passing through said annular second cathode electrode substantially parallel to a surface of said first cathode electrode on which the object to be etched is placed; and
   high-frequency power sources, respectively connected to said first and second cathode electrodes, for generating a plasma by gas discharge, thereby generating ions near said first and second cathode electrodes.

2. An apparatus according to claim 1, wherein frequencies of high-frequency voltages respectively applied from said high-frequency power sources to said first and second cathode electrodes are equal to each other, and said apparatus further comprises means for varying phases of the high-frequency voltages applied to said first and second cathode electrodes.

3. An apparatus according to claim 2 wherein said phase varying means advances a phase of the high-frequency voltage applied to said second cathode electrode from that of the high-frequency voltage applied to said first cathode electrode by 0 to ½ the wavelength.

4. An apparatus according to claim 1, wherein said magnetic field applying means includes a plurality of ring-like coils, said ring-like coils being arranged to be coaxial with said second cathode electrode.

5. An apparatus according to claim 4, wherein said magnetic field applying means comprises a first magnetic field generating coil arranged on a side of said first cathode electrode which is opposite to a side on which said second cathode electrode is present, a second magnetic field generating coil arranged on a side of said second cathode electrode which is opposite to a side on which said first cathode electrode is present, and coil power sources for supplying opposite currents to said first and second magnetic field generating coils.

6. An apparatus according to claim 1, wherein said magnetic field applying means generates a magnetic field whose lines of magnetic force are substantially parallel to surfaces of said first and second cathode electrodes.

7. An apparatus according to claim 6, wherein said magnetic field applying means comprises a first magnetic field generating coil arranged opposite to said anode electrode and near said first cathode electrode, a second magnetic field generating coil arranged to be surrounded by said second cathode electrode, a third magnetic field generating coil arranged to surround said second cathode electrode, and coil power sources for supplying currents having the same direction to said first and third magnetic field generating coils and a current to said second magnetic field generating coil in a direction opposite to that supplied to said first and third magnetic field generating coils.

8. An apparatus according to claim 6, wherein said magnetic field applying means comprises a first magnetic field generating coil arranged opposite to said anode electrode and near said first cathode electrode, a second magnetic field generating coil arranged to surround said first magnetic field generating coil and having a diameter larger than that of said first magnetic field generating coil, a third magnetic field generating coil arranged to be surrounded by said second cathode electrode, a fourth magnetic field generating coil arranged to surround said second cathode electrode, and coil power sources for supplying currents having the same direction to said first and fourth magnetic field generating coils and currents to said second and third magnetic field generating coils in a direction opposite to that supplied to said first and fourth magnetic field generating coils.

* * * * *

UNITED STATES PATENT AND TRADEMARK OFFICE
CERTIFICATE OF CORRECTION

PATENT NO. : 4,963,242

DATED : October 16, 1990

INVENTOR(S) : Sato et al.

It is certified that error appears in the above-identified patent and that said Letters Patent is hereby corrected as shown below:

col. 03, line 55    after "advances"

insert --from the phase of the high-frequency voltage applied to the--

Signed and Sealed this

Fifteenth Day of March, 1994

Attest:

BRUCE LEHMAN

*Attesting Officer*    *Commissioner of Patents and Trademarks*